United States Patent
Aggarwal et al.

(10) Patent No.: US 7,361,949 B2
(45) Date of Patent: Apr. 22, 2008

(54) METHOD OF MAKING A HAZE FREE, LEAD RICH PZT FILM

(75) Inventors: Sanjeev Aggarwal, Plano, TX (US); Kelly J. Taylor, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 80 days.

(21) Appl. No.: 11/046,568

(22) Filed: Jan. 28, 2005

(65) Prior Publication Data
US 2005/0130328 A1    Jun. 16, 2005

Related U.S. Application Data

(62) Division of application No. 10/356,092, filed on Jan. 30, 2003, now abandoned.

(51) Int. Cl.
   *H01L 29/76* (2006.01)
(52) U.S. Cl. .................................... 257/295; 257/300
(58) Field of Classification Search ................ 257/295
   See application file for complete search history.

(56) References Cited

U.S. PATENT DOCUMENTS 6,444,478 B1 *   9/2002   Basceri et al. ................. 438/3

* cited by examiner

*Primary Examiner*—Long Pham
(74) *Attorney, Agent, or Firm*—Rose Alyssa Keagy; W. James Brady, III; Frederick J. Telecky, Jr.

(57) ABSTRACT

An embodiment of the invention is a method of fabricating a haze free, phase pure, PZT layer, 3, where a lead rich PZT film, 102, is formed over a phase pure stoichiometric PZT film, 101.

13 Claims, 2 Drawing Sheets

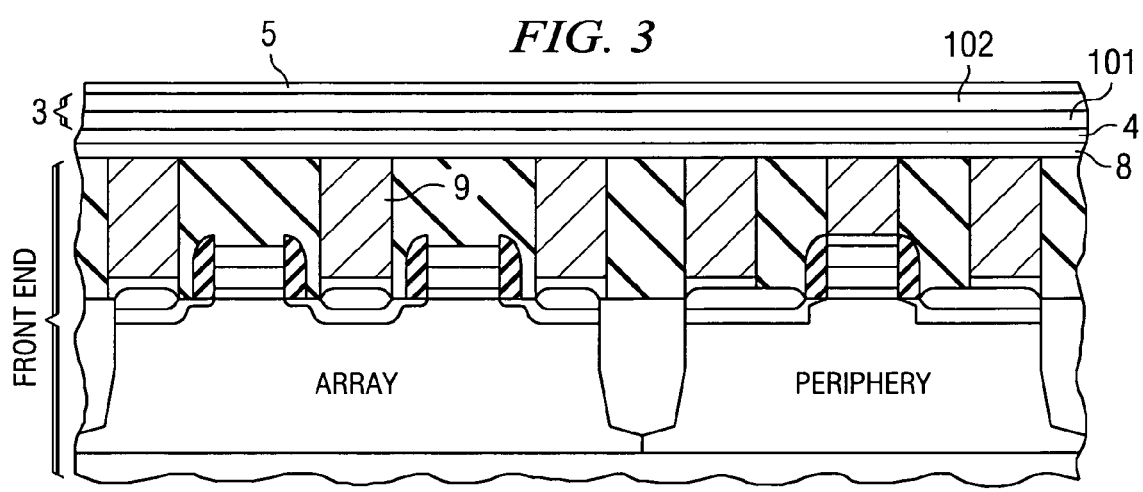

US 7,361,949 B2

METHOD OF MAKING A HAZE FREE, LEAD RICH PZT FILM

CROSS-REFERENCE TO RELATED APPLICATIONS

This is a division of application Ser. No. 10/356,092, filed Jan. 30, 2003, now abandoned the entire disclosure of which is hereby incorporated by reference.

This application is related to application Ser. No. 10/356, 114 filed Jan. 30, 2003 and entitled "Method of Making a Haze Free PZT Film". With its mention in this section, this patent application is not admitted to be prior art with respect to the present invention.

BACKGROUND OF THE INVENTION

During the deposition of the PZT capacitor dielectric layer of a ferroelectric capacitor, PbO is deposited on the walls of the deposition chamber. Thereafter, the PbO deposits will dislodge from the deposition chamber walls and settle onto any semiconductor wafer contained in the chamber. This deposition of PbO on the wafer causes the PZT layer to have haze (roughness). The haze is undesirable and degrades the properties of the ferroelectric capacitor. This invention concerns the fabrication of a lead rich PZT semiconductor wafer layer that is haze free.

BRIEF DESCRIPTION OF THE DRAWINGS

FIG. 3 is a cross-section view of a partially fabricated ferroelectric memory device that is fabricated in accordance with the present invention.

DETAILED DESCRIPTION OF THE INVENTION

Figure 1:
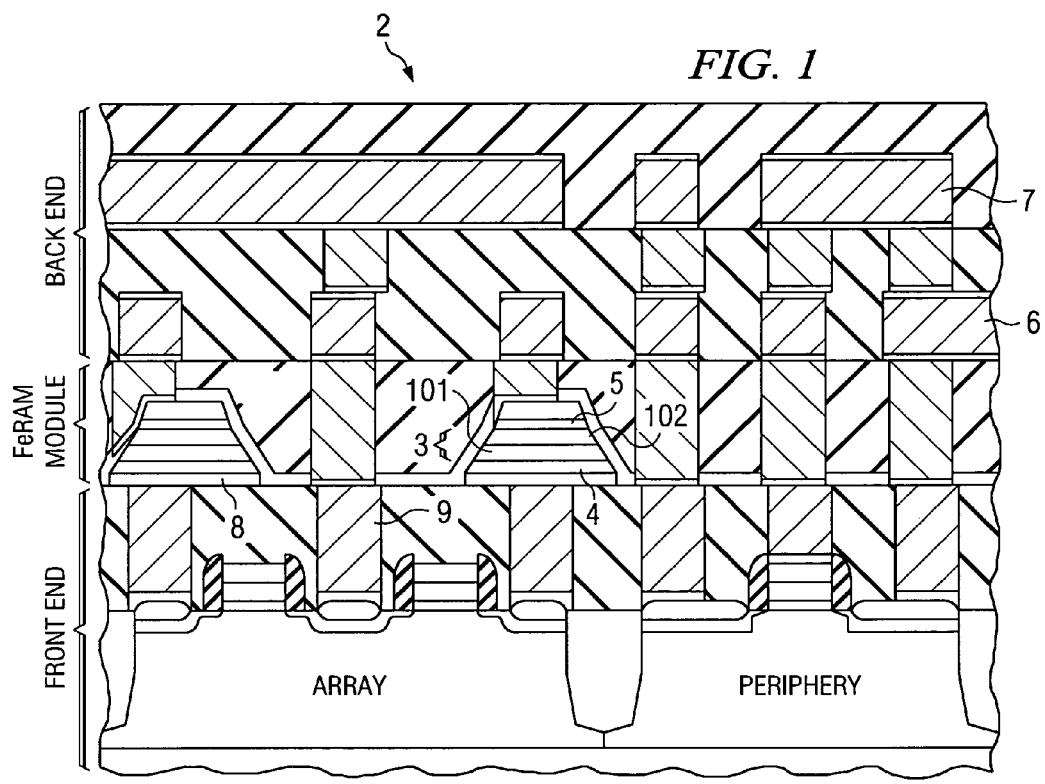
FIG. 1 is a cross-section view of a semiconductor wafer having a PZT film.

The present invention is described with reference to the attached figures, wherein similar reference numerals are used throughout the figures to designate like or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention.

Referring to the drawings, FIG. 1 depicts a cross-section of a portion of a semiconductor wafer, 2, having a haze free, phase pure, PZT layer, 3, in accordance with the invention. More specifically, FIG. 1 shows a partially fabricated FeRAM (ferroelectric memory) array and periphery (which includes most of the rest of the logic chip). In the best mode application the FeRAM module is located between the standard logic front end and back end. The transistor logic is contained in the front-end portion of the wafer (closest to the substrate). The memory module contains non-volatile memory. The device's interconnects and metal lines—used to move electrical signals and power throughout the device—are contained in the back end portion of the wafer. Other than the best mode process of forming the PZT film located in the FeRAM module (described herein), the processing steps for creating the ferroelectric memory device is described in commonly assigned patent/patent application having the application Ser. No. 09/702,985 incorporated herein by reference, and not admitted to be prior art with respect to the present invention by its mention in this section.

The single capacitor memory cell (referred to as a "1T/1C" or "1C" memory cell) has one transistor and one storage capacitor. The bottom electrode of the storage capacitor is connected to the drain of the transistor. In this example application, shown in FIG. 1, the FeRAM memory module is located between the front-end module and the back end module. However, other locations for the FeRAM memory module are within the scope of this invention. For example, the FeRAM module may be placed over the first level of metallization, 6, or near the end of the back end module, 7. Furthermore, it is within the scope of this invention to have a FeRAM module containing a dual capacitor memory cell (comprising two transistors and two ferroelectric capacitors) instead of a single capacitor memory cell.

The FeRAM memory module contains numerous FeRAM memory cells. The ferroelectric capacitor contained within the ferroelectric memory cell is comprised of ferroelectric material, such as lead zirconate titanate (called "PZT" based on its chemical formula: $Pb(Zr, Ti)O_3$) that functions as a capacitor dielectric, 3, situated between a bottom electrode, 4, and a top electrode, 5. In the best mode application, the bottom electrode, 4, is comprised of iridium, iridium oxide, or a stack thereof. Similarly, the top electrode, 5, is comprised of iridium, iridium oxide, or a stack thereof.

Figure 2:
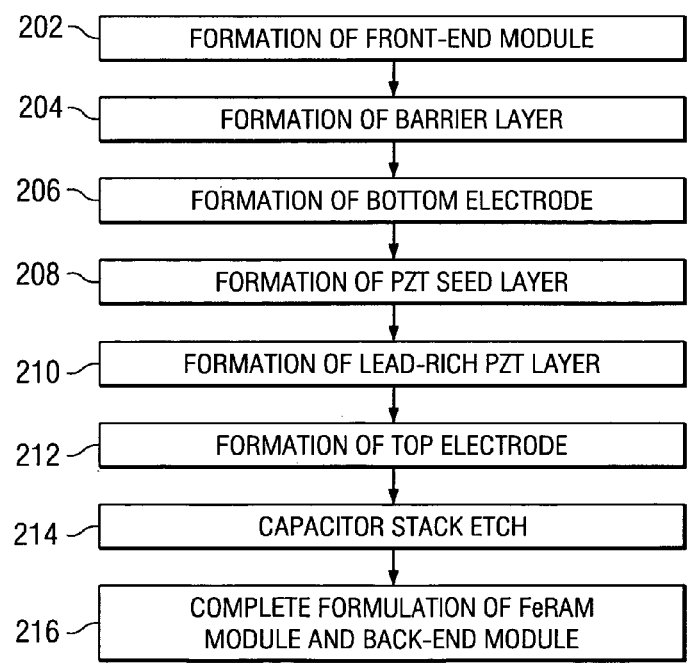
FIG. 2 is a flow diagram illustrating the process flow of the present invention.

Referring now to FIGS. 2 and 3, after the formulation of the front-end module (step 202), there is a barrier layer, 8, formed (step 204) over the contacts, 9 (which are connected to the substrate and gates contained in the front-end module). The conductive barrier, 8, may be formed by a reactive sputter deposition of TiAlN; however, other deposition techniques or barrier materials may be used. For example, instead of using TiAlN as the barrier material, TiAlON, TiN, or a stack having any combination of these three materials may be used.

Next, the bottom electrode, 4, is formed (step 206) on the barrier layer, 8. The bottom electrode, 4, is formed by sputter deposition of Ir (using Ar as the inert gas, but other inert gases may be used). Conversely, the bottom electrode, 4, may be formed by reactive sputter deposition of $IrO_x$ (using $(Ar+O_2)$ as the gas mixture, but inert gases other than Ar may be used in the mixture). However, other deposition techniques may be used to form the bottom electrode, 4, such as chemical vapor deposition. Moreover, other materials may be used for the bottom electrode, such as Pt, Pd, PdOx, Au, Ru, RuOx, Rh, or RhOx.

The next step during the manufacturing process is the deposition of the capacitor dielectric PZT layer, 3, over the bottom electrode, 4. In the best mode application, the PZT layer, 3, formed during this deposition process has two PZT films, namely a stoichiometric film, 101, and a lead rich film, 102. In accordance with the invention, a stoichiometric PZT film, 101, is now formed (step 208) over the bottom electrode, 4. In the best mode application, stoichiometric film 101 is formed by a deposition technique called metal organic chemical vapor deposition ("MOCVD"). The MOCVD deposition process involves delivering $PbO+ZrO_2+TiO_2$ into the deposition chamber containing the semiconductor wafer, 2, to create a $Pb(ZrTi)O_3$ film. As an example, the MOCVD may be performed using a machine such as the Centura manufactured by AMAT (Applied Materials). However, another technique such as chemical solution deposition (sol-gel or metal organic decomposition) can also be used. Moreover, in the example application the Zr to Ti ratio is 20/80; alternatively, pure $PbTiO_3$ may be used (to maximize switched polarization), or $PbZrO_3$ may be used—depending on the electronic device.

In the best mode application the MOCVD deposition process for the PZT film, 101, is done at a wafer temperature of approximately 600° C., a deposition pressure of 8 Torr, with a precursor flow of 200 mg/min, and a deposition rate of 140 Å/min. However variations of these parameters are within the scope of this invention. For example, the wafer temperature may be anything below 700° C., the pressure may be anything greater than 2 Torr, the precursor flow can be anything greater than 100 mg/min, and the deposition rate can be anything greater than 80 Å/min. In this best mode application, an Ar or He carrier gas is used to deliver the precursors to the reactor chamber through the showerhead where they are mixed with an oxidizer such as $O_2$. However, $N_2O$ or $O_3$ may be used as the oxidizer.

In accordance with the invention, the PZT film, 101, created by this process is stoichiometric (i.e. haze free and phase pure). The Pb content of the film may be from $Pb_{0.98}(Zr,Ti)O_3$ to $Pb_{1.0}(Zr,Ti)O_3$. Film 101 is generally 50-100 Å thick. However, it is within the scope of the invention to have a stoichiometric film, 101, with a thickness anywhere between 50-1400 Å. Additionally, the PZT film, 101, may be doped with up to 5% donor dopant. The donor dopant improves the reliability of the PZT by helping to control the point defect concentrations.

Further in accordance with the invention, a lead rich film of PZT, 102, is now formed (step 210) over the haze free, phase pure PZT film, 101. In the best mode application, the lead rich film, 102, is also formed by MOCVD. However, another technique such as chemical solution deposition (sol-gel or metal organic decomposition) can also be used.

The MOCVD deposition process of lead rich film, 102, involves delivering $PbO+ZrO_2+TiO_2$ into the deposition chamber containing the semiconductor wafer, 2. In the example application, the Zr to Ti ratio is 20/80; alternatively, pure $PbTiO_3$ may be used (to maximize switched polarization), or $PbZrO_3$ may be used—depending on the electronic device. The content of Pb is $Pb_{1.02}(Zr,Ti)O_3$; however the amount of Pb can range from 1 to 1.02. Additionally, the lead rich PZT film, 102, may be doped with up to 5% donor dopant. The donor dopant improves the reliability of the PZT by helping to control the point defect concentrations.

In the best mode application the MOCVD deposition process for the PZT film, 102, is done at a wafer temperature of approximately 600° C., a deposition pressure of 8 Torr, with a precursor flow of 200 mg/min, and a deposition rate of 140 Å/min. However variations of these parameters are within the scope of this invention. For example, wafer temperatures may be anything below 700° C., the pressure may be anything greater than 2 Torr, the precursor flow can be anything greater than 100 mg/min, and the deposition rate can be anything greater than 80 Å/min. In this best mode application, an Ar or He carrier gas is used to deliver the precursors to the reactor chamber through the showerhead where they are mixed with an oxidizer such as $O_2$. However, $N_2O$ or $O_3$ may be used as the oxidizer.

The PZT layer, 102, created by this process is lead rich. However it is also haze free and phase pure because it was deposited on top of the perovskite film, 101. Film 102 is generally 600-650 Å thick. (As an example, if the PZT layer, 3, is 700 Å and the stoichiometric film, 101, is 50 Å; then the lead rich film, 102, is 650 Å.) However, it is within the scope of the invention to have a lead rich PZT film, 102, with a thickness anywhere between 0-1400 Å.

Together, the stoichiometric PZT film, 101, and the lead rich PZT film, 102, comprise the lead rich ferroelectric capacitor dielectric layer, 3. It is within the scope of the invention to use any combination of the above inventive techniques to create the high lead content capacitor dielectric layer, 3. For example, the lead rich dielectric layer, 3, may be created using only the two film structure, using the two film structure manufactured using an increased deposition pressure (i.e. changing from 2 Torr to 4 Torr), or using the two film structure manufactured with an increased precursor flow (i.e. changing form 100 mg/min to 200 mg/min). The high lead content PZT dielectric layer, 3, will cause the ferroelectric capacitor to have desirable endurance, durability, and reliability. Furthermore the haze free, phase pure PZT film, 3, formed in accordance with the present invention will operate at a lower operating voltage and therefore reduce the power consumption of electronic devices.

Next, the top electrode, 5, is formed (step 212) on the capacitor dielectric layer, 3. In the example application, the top electrode, 5, is formed by sputter deposition of Ir (using Ar as the inert gas, but other inert gases may be used). Conversely, the top electrode, 5, may be formed by reactive sputter deposition of $IrO_x$ (using $(Ar+O_2)$ as the gas mixture, but inert gases other than Ar may be used in the mixture). However, other deposition techniques may be used to form the top electrode, 5, such as chemical vapor deposition. Furthermore, other materials may be used for the top electrode, such as Pt, Pd, PdOx, Au, Ru, RuOx, Rh, or RhOx.

Next, the entire capacitor stack (comprised of barrier, 8, bottom electrode, 4, capacitor dielectric, 3, and tope electrode, 5) is patterned, etched, and cleaned to form (step 214) the final ferroelectric capacitor structure. Lastly, the formation (step 216) of the final electronic device structure continues, including the completion of the FeRAM module and the back-end module.

Various modifications to the invention as described above are within the scope of the claimed invention. As an example, the instant invention can be used to fabricate stand-alone FeRAM devices or FeRAM devices integrated into a semiconductor chip that has many other device functions than those described herein. In addition, instead of forming the bottom electrode, 4, on the barrier layer, 8; the bottom electrode, 4, may be formed directly on the front-end module. Although this invention description focuses on the formation of planar capacitors, a three-dimensional capacitor using a post or cup structure can be fabricated with the same inventive process. Furthermore, the invention is applicable to semiconductor wafers having different well and substrate technologies, transistor configurations, and metal connector materials or configurations. Moreover, the invention is applicable to other semiconductor technologies such as BiCMOS, bipolar, SOI, strained silicon, pyroelectric sensors, opto-electronic devices, microelectrical mechanical system ("MEMS"), or SiGe.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A haze free, lead rich PZT layer prepared in accordance with the method comprising:
   forming a front-end structure over a semiconductor substrate;
   forming a bottom electrode over said front-end structure;
   forming a phase pure and stoichiometric PZT film over said bottom electrode; and
   forming a lead rich PZT film over said phase pure and stoichiometric PZT film.

2. The haze free, lead rich PZT layer of claim 1 wherein a thickness of said phase pure and stoichiometric PZT film is less than a thickness of said lead rich PZT film.

3. The haze free, lead rich PZT layer of claim 1 wherein said phase pure and stoichiometric PZT film has a thickness less than a total thickness of said layer of PZT.

4. The haze free, lead rich PZT layer of claim 1 wherein said lead rich PZT film has a thickness less than a total thickness of said layer of PZT.

5. The haze free, lead rich PZT layer of claim 1 wherein said lead rich PZT film has a Pb concentration greater than the Pb concentration of said phase pure and stoichiometric PZT film.

6. The haze free, lead rich PZT layer of claim 1 wherein said stoichiometric PZT film is a solid solution of the component end members $PbZrO_3$ and $PbTiO_3$.

7. The haze free, lead rich PZT layer of claim 1 wherein said stoichiometric PZT film is doped up to 5% with either La or Nb.

8. The haze free, lead rich PZT layer of claim 1 wherein said lead rich PZT film is a solid solution of the component end members $PbZrO_3$ and $PbTiO_3$.

9. The haze free, lead rich PZT layer of claim 1 wherein said lead rich PZT film is doped up to 5% with either La or Nb.

10. The haze free, lead rich PZT layer of claim 1 wherein said stoichiometric PZT film can be $PbZrO_3$.

11. The haze free, lead rich PZT layer of claim 1 wherein said stoichiometric PZT film can be $PbTiO_3$.

12. The haze free, lead rich PZT layer of claim 1 wherein said lead rich PZT film can be $PbZrO_3$.

13. The haze free, lead rich PZT layer of claim 1 wherein said lead rich PZT film can be $PbTiO_3$.

* * * * *